United States Patent [19]

Tice et al.

[11] Patent Number: 5,661,422
[45] Date of Patent: Aug. 26, 1997

[54] HIGH SPEED SATURATION PREVENTION FOR SATURABLE CIRCUIT ELEMENTS

[75] Inventors: Thomas E. Tice, Greensboro; David T. Crook, Summerfield; Kevin M. Kattmann; Charles D. Lane, both of Greensboro, all of N.C.

[73] Assignee: Analog Devices, Inc., Norwood, Mass.

[21] Appl. No.: 571,243

[22] Filed: Dec. 12, 1995

[51] Int. Cl.$^6$ ................................................ H03K 5/153
[52] U.S. Cl. ................... 327/74; 327/58; 361/86; 361/90
[58] Field of Search ..................... 327/74, 58, 88; 361/86, 90, 91, 87, 93

[56] References Cited

U.S. PATENT DOCUMENTS

| | | | |
|---|---|---|---|
| 3,800,198 | 3/1974 | Graf et al. | 318/227 |
| 4,237,509 | 12/1980 | Asplund | 361/56 |
| 4,571,656 | 2/1986 | Ruckman | 361/56 |
| 4,613,770 | 9/1986 | Raab | 327/74 |
| 4,616,305 | 10/1986 | Damiano et al. | 363/132 |
| 4,703,191 | 10/1987 | Ferguson | 307/64 |
| 4,713,740 | 12/1987 | Drabing | 363/17 |
| 4,815,052 | 3/1989 | Walker | 363/87 |
| 4,823,227 | 4/1989 | Grant | 361/90 |
| 5,089,925 | 2/1992 | Lester | 361/84 |
| 5,111,353 | 5/1992 | Kotowski et al. | 361/91 |
| 5,319,259 | 6/1994 | Merrill | 307/443 |
| 5,325,258 | 6/1994 | Choi et al. | 361/87 |
| 5,400,237 | 3/1995 | Flanagan et al. | 363/41 |
| 5,479,119 | 12/1995 | Tice et al. | 327/74 |
| 5,498,985 | 3/1996 | Parle et al. | 327/74 |

OTHER PUBLICATIONS

Grebene, *Bipolar and MOS Analog Integrated Circuit Design*, John Wiley & Sons, 1984, pp. 835–866.
Allen et al., *CMOS Analog Circuit Design*, Holt, Rinehart and Winston, Inc. 1987 pp. 198–204.

*Primary Examiner*—Terry Cunningham
*Assistant Examiner*—Jung Ho Kim
*Attorney, Agent, or Firm*—Koppel & Jacobs

[57] ABSTRACT

A protection circuit inhibits saturation and damage of sensitive circuit elements when an input signal goes out of a nominal input range. The protection circuit includes an out-of-range detector which compares the input signal to reference levels to determine if it is within the range. If it is not, a control circuit substitutes a supplemental signal that is slightly out of range, but not so far out of range as to cause any substantial saturation. Supplemental signal sources that produce supplemental signals slightly outside the high and low ends of the range with error margins, not more than about 750 mV, that lie just outside the range; an out-of-range input is replaced by the supplemental signal with the closest value. The invention is particularly applicable to multistep/subranging analog-to-digital/converters.

20 Claims, 4 Drawing Sheets

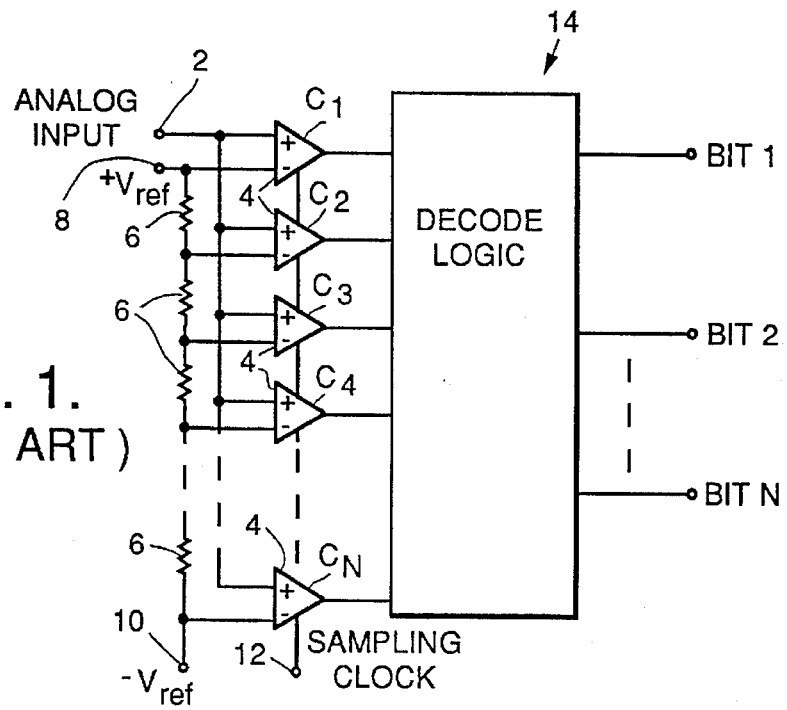
FIG. 1. (PRIOR ART)
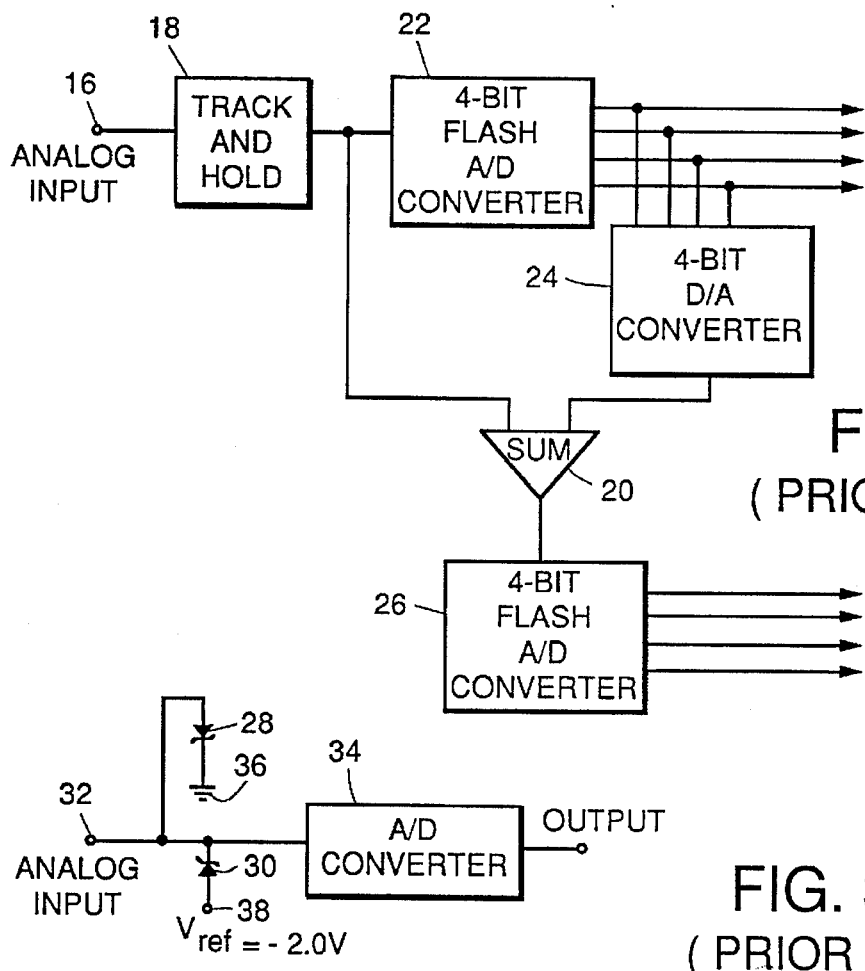
FIG. 2. (PRIOR ART)
FIG. 3a. (PRIOR ART)

HIGH SPEED SATURATION PREVENTION FOR SATURABLE CIRCUIT ELEMENTS

BACKGROUND OF THE INVENTION

1. Field of the Invention

This invention relates to saturating voltage detection and prevention for use with saturable circuit elements such as high speed multistep/subranging analog to digital converters.

2. Description of the Related Art

An analog to digital (A/D) converter is a device designed to convert an analog waveform into a series of digital words. The input of such a device is generally a continuously varying voltage signal; the output is a multi-bit step voltage signal representing a digital output (ones and zeroes). Within an A/D converter the input signal is compared to multiple reference voltages at periodic time intervals (the sampling rate). These comparisons measure whether the input voltage is greater than or less than a series of reference levels, in total thereby producing an output which approximately describes the state of the varying input. Unlike the analog input which is continuous, the comparisons are characteristically quantized, and therefore have a finite resolution that corresponds to the size of the intervals between successive reference voltage levels.

An issue with analog to digital conversion is that the conversion process takes a finite amount of time, meaning that the sampling cycle cannot be set arbitrarily short to accommodate a high frequency input. There are many different types of converters with conversion times ranging from greater than one second (sampling less than once per second) to less than two nanoseconds. Different materials and designs for A/D converters are best suited for different operating speeds; the specific application typically defines the type of converter employed. Several different designs are described in Grebene, *Bipolar and MOS Analog Integrated Circuit Design*, John Wiley & Sons, 1984, pages 835–866.

Parallel or simultaneous A/D converters are generally regarded as some of the fastest designs. They use separate comparators in parallel for each quantization step (as opposed to using the same comparators repeatedly with changing reference voltages, or multiple comparators in series). Parallel A/D conversion is capable of completing an entire conversion operation in one step, and thus is referred to as flash conversion. FIG. 1 illustrates the basic design of an N-bit flash converter.

In the flash A/D converter shown in FIG. 1, an analog input is provided at terminal 2 and is transmitted to the variable inputs of a series of comparators 4 (there are $2^N-1$ comparators in an N-bit flash converter). A reference voltage is maintained across a series of resistors 6 from positive $V_{ref}$ terminal 8 to negative $V_{ref}$ terminal 10. These resistors 6 provide the step interval reference voltages which are applied to the reference inputs of the comparators 4. Comparators 4 compare their reference and variable input signals at time intervals determined by a sampling signal applied at terminal 12. The outputs of the $2^N-1$ comparators are combined by a decode logic subcircuit 14 to generate an N bit digital word.

To increase converter resolution with minimal increases in die area and power requirements, multiple flash converters may be combined. One such assembly is the multi-step/subranging converter. A conventional multistep/subranging converter, shown in FIG. 2, divides the conversion process into two steps. An analog input is supplied at input terminal 16 and directed to a track and hold element 18. The output of the track and hold is directed to both a summing amplifier 20 and the input of a first flash converter 22. The flash converter 22 generates an output which forms the first digits (in this case 4 bits) of the digital output word. This output is transmitted to a digital-to-analog (D/A) converter 24, which converts it back into an analog signal. The analog signal output of the D/A converter 24 is directed to a summing amplifier 20 which compares it with the original input, producing a residue signal that contains the finer details of the input information not resolved by the first conversion. The residue signal is then directed to a second flash converter 26 for finer quantization. The output of the second flash converter 26 is the second half of the digital output word. If the residue signal doesn't fall exactly in the voltage range of the second flash converter, however, that converter cannot function properly and missing codes result. The residue signal is often amplified. The amplication of the residue signal increases the effective sensitivity of the second converter to overvoltage signals.

Many of the fastest A/D converters utilize bipolar junction transistors (BJTs) for their high speed capabilities. When a BJT is subject to an overvoltage it is driven out of its linear operating range into saturation. Thus the flash converters 22 and 26 are especially susceptible to overvoltages. Even if the overvoltage is mild, a BJT driven out of its linear operating range into saturation requires time to recover. The recovery time is partially dependent upon the magnitude of the overvoltage, but it is often more than several conversion cycles. Extreme over-voltages can permanently damage the converter. During saturation, missing or incorrect codes often occur.

In the prior art, such overvoltage problems were remedied with input diode clamps, e.g., Schottky diodes. An example of a prior overvoltage protection design is shown in FIG. 3a. A pair of diodes 28 and 30 respectively have their anode and cathode connected to the analog input terminal 32 of the A/D converter 34. The opposite ends of diodes 28 and 30 are connected to different voltage references 36 and 38 which are respectively illustrated as ground and a negative voltage $V_{ref}$. The different voltage references together define the limits of a range of input signals which may be transmitted to the A/D converter. When the input signal is not in the defined range one of the diodes (the diode corresponding to the range limit which is being exceeded) clamps the circuit.

With an ideal circuit, it would be possible to set the diodes' clamping voltages exactly equal to the extreme limits of the desired input range. In practice, however, diodes are not able to switch from open to conductive (clamping the circuit) abruptly within arbitrarily narrow voltage ranges. FIG. 3b illustrates the operation of a pair of typical diodes 28 and 30, having a forward bias breakdown voltage of 0.6 volts in controlling the voltage $V_{ADC}$ applied to the input of the A/D converter 34 as a function of an attempted input voltage $V_{in}$. Three distinct types of response are evident: (1) linear conduction in region 40 which corresponds to input voltages well within the limits of the conduction range, (2) constant secure clamping, in regions 42 and 44, which corresponds to input voltages well beyond the limits of the conduction range, and (3) non-linear response, in regions 46 and 48, which corresponds to input voltages near a limit of the conduction range (near a clamping voltage of one of the diodes). Without an abrupt open to conductive transition, clamp level selection involves a tradeoff between protecting the BJTs from saturating overvoltages, and preserving a linear operation. Selecting a clamp level that securely clamp before the input put voltage has reached a level which saturates the BJTs results in a non-linearity that distorts the extremes of acceptable input. Conversely a clamp voltage that ensures a completely linear operation involve a diode activating forward voltage drop which exceeds the voltage necessary to saturate the BJTs.

Preserving linearity is usually of paramount importance. Departing from a linear operating range causes the converter's digital output to vary from the input signal. Furthermore, when the BJTs do return to a linear range it is necessarily from an extreme voltage level, which further delays ideal response and increases the duration of false outputs. The result of the trade-off is thus typically to preserve linearity at the cost of the transistor saturation.

SUMMARY OF THE INVENTION

The present invention seeks to provide a new circuit and method of detecting out-of-range input signals and inhibiting saturation and overvoltage damage caused by such signals in saturable circuit elements, such as those used in high speed multistep/subranging A/D converters.

These objectives are achieved with an active overvoltage input signal detector which determines if the input signal is within a nominal non-saturating range; a supplemental signal source which produces a signal that is slightly outside the nominal range but by an amount that is insufficient to substantially saturate the protected element; and a control circuit which responds to the detector determining that the input signal is outside the nominal range by substituting the supplemental signal for the out-of-range signal as the input to the saturable circuit element. In a preferred embodiment supplemental signals are provided both slightly above and slightly below the nominal non-saturating range, with the supplemental signal on the same side of the nominal range as a detected out-of-range input substituted for the input. The supplemental signal is produced within an error margin that is slightly outside the nominal range, but does not extend more than about 750 mV from the nominal range limit. The control circuit preferably includes logic gates which respond to the detector determination and control switches which substitute the selected supplemental signal for the out-of-range signal.

Multiple layers of this type of protection circuitry may be employed to separately protect input buffers, multiple flash converters, signal processing elements, and other protection circuitry of the same type having multiple fragile input signal detectors.

These and other features and advantages of the invention will be apparent to those skilled in the art from the following detailed description, taken together with the accompanying drawings.

BRIEF DESCRIPTION OF THE DRAWINGS

FIG. 1, described above, is a block diagram of an N-bit parallel A/D converter.

FIG. 2, described above, is a block diagram of a prior 8-bit subranging A/D converter.

FIG. 3a, described above, is a block diagram of a prior passive clamping type overvoltage protection circuit, while FIG. 3b is a output voltage plot of a pair of clamping diodes in a circuit as illustrated in FIG. 3a.

DETAILED DESCRIPTION OF THE INVENTION

While the invention is described herein in connection with multistep/subranging A/D converters, it is also applicable to the protection of other saturable circuit elements. Accordingly, references to specific circuit elements are to be understood as being illustrative and exemplary of specific embodiments within the broad scope of the invention, and not as limiting that broad scope. Like numbers refer to like elements.

In a related patent application by the present inventors, Ser. No. 08/344,452 filed Nov. 23, 1994, overvoltage protection is provided by disconnecting the input signal to a sensitive circuit when the input signal goes out of range, and substituting a supplemental input signal within the circuit's acceptable input range. While this protects the circuit elements from saturating, its preferred implementation in an A/D converter requires the addition of a digital correction circuit at the converter output for acceptable accuracy. The present invention avoids the need for a digital correction circuit, yet still allows sensitive circuit elements to remain in their linear operating ranges without saturating, thus avoiding the lengthy recovery times associated with saturated devices.

While acceptable input voltage ranges (such as 3–4 volts) are specified for circuits such as A/D converters that have saturable input elements (the converter output does not change when its input goes out-of-range), these ranges are nominal with respect to saturation and include a margin of safety so that input voltages slightly above or below the nominal range can also be accepted without causing any substantial saturation. The invention utilizes this fact by substituting a fixed supplemental signal that is only slightly out of range for an out-of-range input signal, and selecting the supplemental signal so that it is on the same side of the nominal input range as the disconnected input signal. The supplemental signal source has an output error margin that ensures the actual supplemental signal will remain out of range. This produces a considerably more accurate output than does the mid-scale supplemental signal taught in Ser. No. 08/344,452. It also ensures that any residual error will be equal to a voltage differential that is limited to one side of the nominal input range, and avoids the need for a digital correction circuit. Furthermore, although Ser. No. 08/344,452 also teaches the use of supplemental signals at the limits of (but still within) the input range, in practice a voltage source that is accurate enough to produce a supplementary signal at exactly the limit of the input range (to within the accuracy of present A/D converters, such as 10 bits) would be very expensive. More practical voltage sources have a higher output error range that can result in the actual supplemental signal being well within the input range, with a correspondingly greater output error from the protected circuit.

Figure 4:
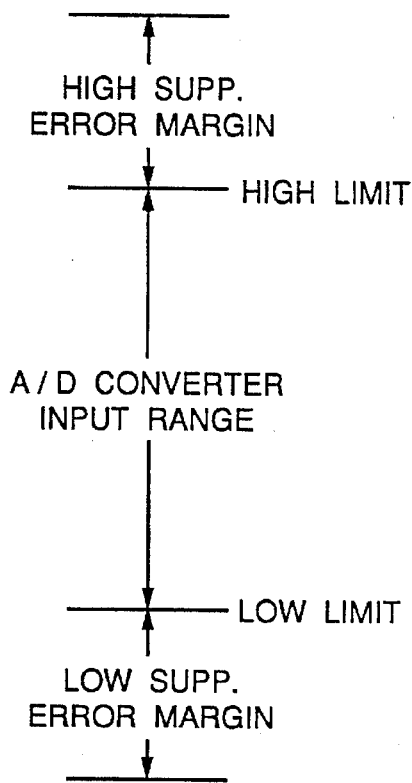
FIG. 4 is a diagram illustrating the approach taken by the present invention.

The general approach taken by the invention as applied to a multistep/subranging A/D converter is illustrated in FIG. 4. The converter has HIGH and LOW input voltage limits at the opposite ends of its nominal input range, beyond which input signals will produce outputs that are fixed at the converter's high or low digital output limits. When the input signal becomes greater than the HIGH input voltage limit, the input signal is disconnected and a signal from a supplemental voltage source is substituted. The supplemental voltage source produces an output with an error margin that lies immediately above the HIGH limit of the nominal input range. The error margin is small enough so that the supplemental signal cannot go so far out-of-range that it would cause substantial saturation of the BJTs or other saturable elements in the converter. Common inexpensive voltage sources with an output error margin of up to about 750 mV can be used for this purpose; in practice, low cost voltage sources with considerably lower error margins are available. The invention thus preemptively disconnects saturating input signals before the overvoltage can saturate, damage or delay the protected circuit elements.

Similarly, another supplemental voltage source produces a second supplemental signal within an error margin that lies immediately below the nominal input range; this supplemental signal is substituted for the input signal when the input goes out-of-range below the converter's nominal input range. Again, out-of-range supplemental inputs up to about 750 mV below the nominal input range can be tolerated without substantial saturation. The LOW supplemental voltage source can be either separate from the HIGH source, or combined with the HIGH source in a single source with dual outputs.

Figure 5:
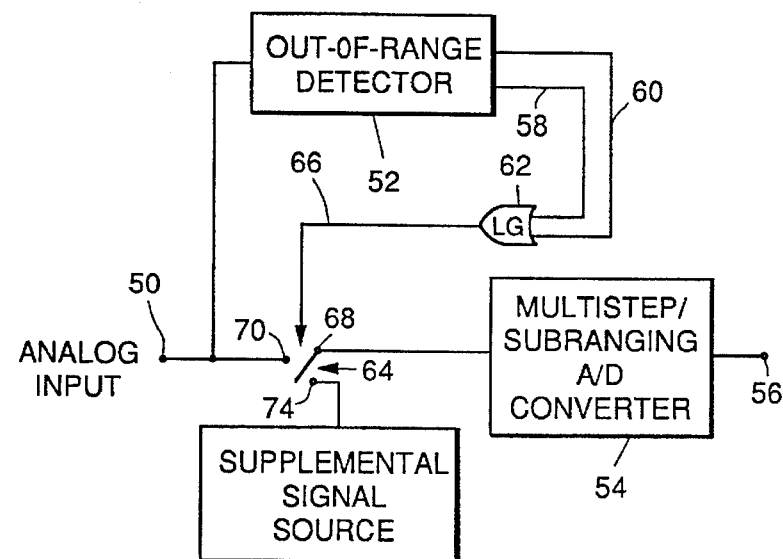
FIG. 5 is a block diagram of a generalized saturation inhibition circuit which uses the present invention.

FIG. 5 illustrates a basic circuit for implementing the invention. An analog input signal is supplied to the circuit at input terminal 50. An out-of-range overvoltage detector 52 receives the input signal and determines whether the input is out of the operating voltage range of a specific subcircuit element 54 (such as a multistep/subranging A/D converter which uses bipolar junction transistors) or of other elements which may be connected beyond an output terminal 56.

The output of the detector 52 is transmitted along dual detector output signal lines 58 and 60 to a control circuit. The control circuit of this embodiment includes a logic gate 62 (preferably an OR gate) and a switch 64. Logic gate 62 produces a signal, in response to the output of the detector 52, which is transmitted along line 66 to switch 64 (a switch of the type used in these embodiments is described in Allen et al., *CMOS Analog Circuit Design*, Holt, Rinehart and Winston, Inc., 1987, pages 198–204). The fixed terminal 68 of switch 64 is connected as a direct input for an overvoltage sensitive subcircuit element 54, which is illustrated as a multistep/subranging A/D converter. When the detector 52 determines that the input signal is within the proper range it causes the switch 64 to connect to terminal 70, which is tied to the input terminal 50, thereby providing a true analog input to the subcircuit element 54. If the input signal is determined by the detector 52 to be out of range, such as by sensing an overvoltage at the input, a signal is transmitted by the detector 52 that induces logic gate 62 to produce an output which causes the switch to disconnect the subcircuit element 54 from the true analog input, and instead to connect it to the output of a supplemental signal source 72 (a voltage generator in the preferred embodiment) at supplemental signal terminal 74. The supplemental signal source 72 maintains a slightly out-of-range input signal voltage for the subcircuit element 54 for the duration of the input overvoltage condition. The output of subcircuit element 54 is applied to the output terminal 56.

The determination of whether the input signal is out of the nominal input voltage range is made by comparators, within the out-of-range detector 52, which have a high common mode input range and inputs free from overvoltage recovery problems. Comparators of this type can be designed with different transistor types, such as metal oxide semiconductor field effect transistors (MOSFETs) or bipolar devices. If bipolar transistors are used, the input stage would need to be designed to provide a wider common mode range to avoid saturation.

Figure 6:
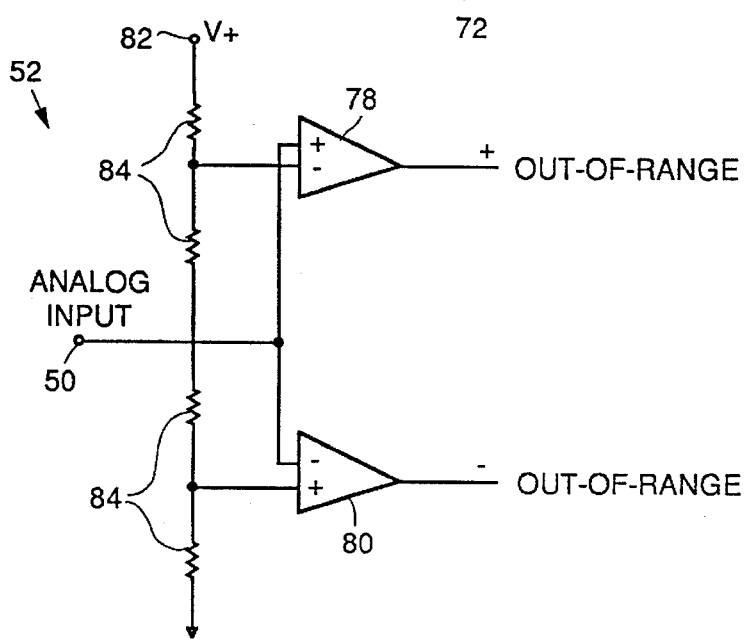
FIG. 6 is a schematic diagram of a preferred out-of-range voltage detector for use in the circuit of FIG. 5.

FIG. 6 illustrates the components and function of one possible configuration of the out-of-range detector 52. The analog input at terminal 50 is directed to variable inputs of comparators 78 and 80. The comparators compare the input signal with predetermined reference voltage levels to determine whether the signal exceeds an acceptable range. One comparator 78 determines if the signal exceeds the upper limit of the range, while the other comparator 80 determines if the signal exceeds the lower limit. The reference voltages for the comparators 78 and 80 can be supplied in numerous ways, such as through a series of voltage divider resistors 84, with the reference levels tapped off the resistor chain. Since the comparators are designed with a high common mode input range, they are relatively free of overvoltage recovery problems.

Figure 7:
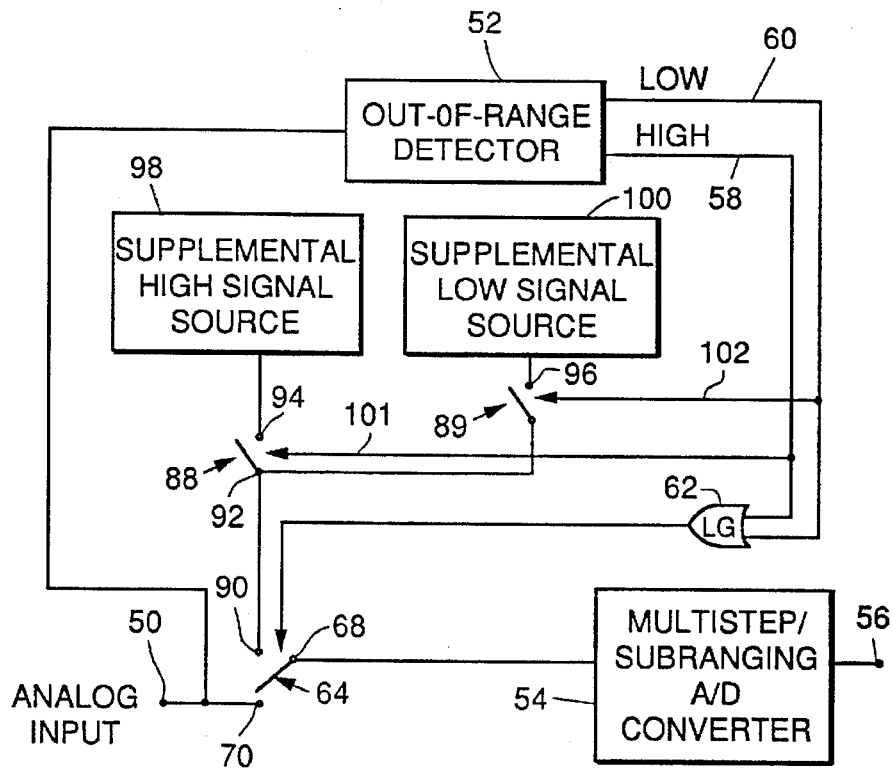
FIG. 7 is a block diagram of a circuit that implements the invention with both high and low supplemental voltage sources.
Figure 3B:
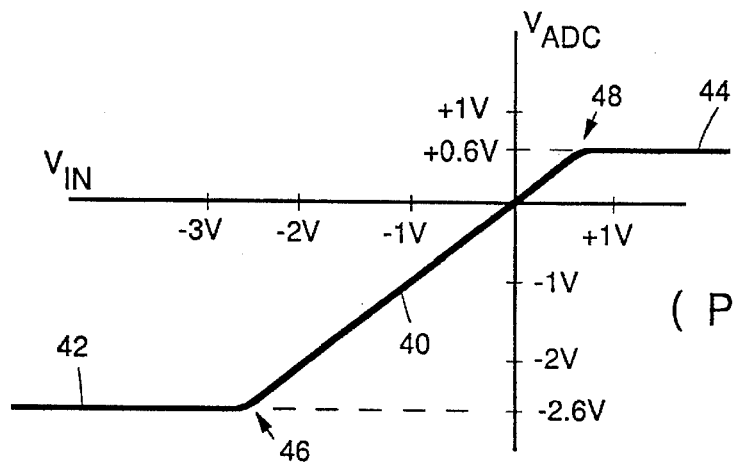

FIG. 7 illustrates the use of separate HIGH and LOW supplemental signal sources. An analog voltage input is again received by the circuit at input terminal 50 and is determined to be either in or out of range by a detector 52 and, if it is out of range, then whether the voltage is above or below the nominal input range (in the manner described with reference to FIG. 6). The determination made by detector 52 is transmitted over dual detector output signal lines 58 and 60 to a control circuit, with a signal on line 58 indicating an out-of-range HIGH input and a signal on line 60 indicating out-of-range LOW. The control circuit includes an OR gate logic element 62 which controls the switch 64, and a pair of additional switches 88 and 89. As in the embodiment of FIG. 5, the fixed terminal 68 of switch 64 is connected as a direct input for the A/D converter 54.

If the input signal is within the input voltage range for the converter 54, the signal from OR gate 62 causes switch 64 to connect the converter 54 to the true analog input signal at input terminal 70. If the input signal is out of range, OR gate 62 causes switch 64 to disconnect converter 54 from the true input and connect it instead to a terminal 90 that is connected to a fixed terminal 92 for both of the additional switches 88 and 89. The opposite terminals 94 and 96 of switches 88 and 89 are respectively connected to alternate supplemental signal sources 98 and 100. Control lines 101 and 102 are tapped off the HIGH and LOW output lines 58 and 60, respectively, of the out-of-range detector 52 and respectively control switches 88 and 89, which are normally open. If out-of-range detector 52 determines that the input signal is beyond the upper limit of the input range, switch 88 is closed to connect the input of the A/D converter 54 through switch 64 to the HIGH supplemental signal source 98, which provides a voltage input as described above that is slightly above the upper limit of the converter's input range. If the input voltage is determined to be less than the lower limit of the input range, switch. 89 closes to connect the LOW supplemental signal source 98, which as described above provides a voltage input that is slightly below the lower limit of the input range, to the A/D converter input through the switch 64.

Various alternate switching schemes could also be used, such as having a single switch that switches between the HIGH and LOW supplemental signal sources as inputs to the A/D converter through switch 64, with the alternate switch normally connected to the LOW supplemental signal source. When a HIGH signal appears on output line 58 from the out-of-range detector, the switch would switch over to the HIGH source.

Figure 8:
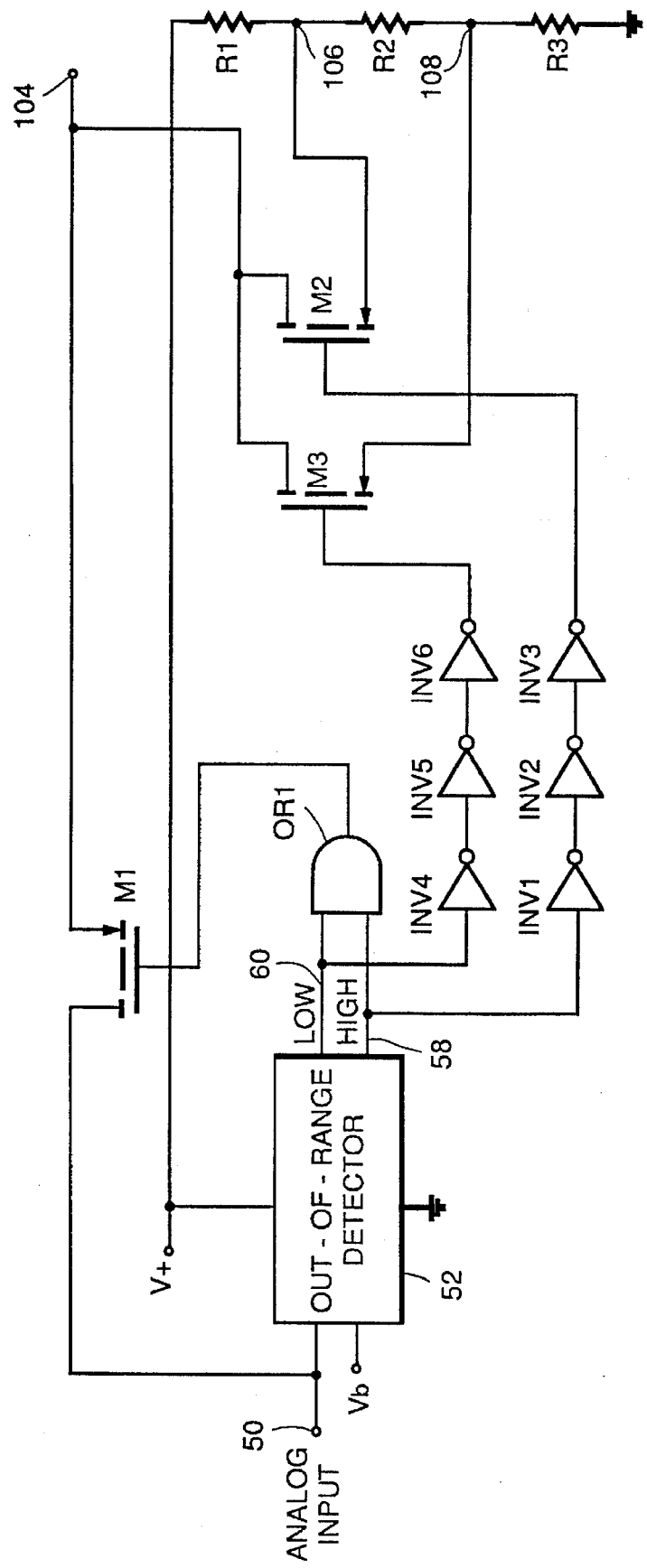
FIG. 8 is a schematic diagram of a preferred clamp circuit for use in the circuit of FIG. 5.

Further details of an input clamp circuit that clamps the input to a protected circuit at a HIGH or LOW supplemental voltage value in response to the input signal going out-of-range are shown in FIG. 8. The analog input at input terminal 50 and a bias voltage Vb are applied to the out-of-range detector 52, which has HIGH and LOW output lines 58 and 60 that are respectively activated when an out-of-range high or low input is detected. Lines 58 and 60 are connected as the inputs to an OR gate OR1, which produces a LOW output only when neither line 58 nor 60 is active (corresponding to an in-range input at terminal 50). The source-drain circuit of a P-MOSFET switch M1 connects the input terminal 50 to the input of the protected circuit, indicated by terminal 104. The output of OR1 is connected to the gate of M1 and drives that transistor into conduction when the OR1 output is LOW, thus connecting the analog input at terminal 50 directly to the protected circuit input at terminal 104 when the input signal is in-range. If the output of OR1 is HIGH, indicating an out-of-range input signal, the M1 switch is opened and disconnects the input to the protected circuit from the analog input.

The supplemental HIGH and LOW signal sources 98 and 100 of FIG. 7 are implemented by a voltage divider circuit consisting of three resistors R1, R2 and R3 connected in series between a positive voltage bus V+ and ground. For a positive supply of 5 volts, an R1/R2/R3 resistance ratio of 1/1/3 will produce a HIGH voltage of 4 volts at the junction 106 of R1 and R2, and a LOW voltage of 3 volts at the junction 108 of R2 and R3, which correspond to the input voltage range of a typical high speed multistep/subranging A/D converter. In reality, the exact voltage levels at junctions 106 and 108 will be unpredictable, since both the resistance values and the value of V+ have tolerances. However, the nominal resistor values can be adjusted so that the actual voltage at junction 106 will exceed 4 volts but by not more than about 750 mV, while the actual voltage at junction 108 will be less than 3 volts but again by not more than about 750 mV, for any resistor and V+ values within their respective tolerances. This can be accomplished, for example, by reducing the nominal values of R1 and R3, increasing the nominal value of R2, or by a combination of these adjustments.

The protected circuit input 104 is connected via a pair of MOSFET switches M2 and M3 to the HIGH and LOW junctions 106 and 108, respectively. These switches are operated respectively by the HIGH and LOW outputs 58 and 60 from the out-of-range detector 52 so that a HIGH supplemental signal from junction 106 is provided to terminal 104 when the analog input at terminal 50 is out-of-range on the high side, and a LOW supplemental signal from junction 108 is provided to terminal 104 when the analog input is out-of-range on the low side. A series of inverters INV1, INV2 and INV3 are connected in series between HIGH detector output line 58 and the gate of M2, and a similar series of inverters INV4, INV5 and INV6 are connected in series between LOW detector output line 60 and the gate of M3, to compensate for propagation delays through the OR1 gate and allow switches M2 and M3 to switch at the same time as M1.

While particular embodiments of the invention have been shown and described, numerous variations and alternate embodiments will occur to those skilled in the art. Accordingly, it is intended that the invention be limited only in terms of the appended claims.

We claim:

1. A saturation inhibition circuit for protecting a saturable circuit element from input signals outside a nominal non-saturating signal range, comprising:

an out-of-range signal detector for determining whether an input signal to said element is outside said range, a supplementary signal source for providing a supplementary signal that is slightly outside said nominal range by an amount insufficient to substantially saturate the circuit element, and a control circuit that responds to said out-of-range signal detector to substitute said supplementary signal as the input to said element when said input signal goes out of said range.

2. The circuit of claim 1, wherein said supplementary signal source produces said supplementary signal within an error margin that is slightly outside said range.

3. The circuit of claim 2, wherein the error margin of said supplementary signal source extends no more than about 750 mV outside of said nominal range.

4. The circuit of claim 1, wherein said supplementary signal source provides a pair of supplementary signals slightly above and below said range, said out-of-range signal detector determines whether an out-of-range input signal is above or below said range, and said control circuit substitutes the supplementary signal that is on the same side of said range as an out-of-range input signal.

5. The circuit of claim 1, wherein the control circuit comprises a switch which disconnects said input signal from said element when said signal goes out of range, and connects said supplementary signal to said element.

6. The circuit of claim 5, wherein the control circuit further comprises a logic gate which responds to said out-of-range detector and controls said switch.

7. The circuit of claim 1, wherein said saturable circuit element comprises a bipolar junction transistor circuit.

8. The circuit of claim 1, wherein said saturable circuit element comprises a multistep/subranging analog to digital converter.

9. A saturation inhibition circuit for protecting a saturable circuit element from input signals outside a nominal non-saturating signal range, comprising:

an out-of-range signal detector for determining whether an input signal to said element is outside said range, a plurality of supplementary signal sources for providing supplementary signals that are slightly outside of said nominal range and on opposite sides of said range, by amounts insufficient to substantially saturate the circuit element, and a control circuit that responds to said out-of-range signal detector detecting an input signal outside said range by substituting for said input signal a selected one of said supplementary signals on the same side of said range as the input signal.

10. The circuit of claim 9, wherein said supplementary signal sources produce said supplementary signals within respective error margins that are slightly outside said range.

11. The circuit of claim 10, wherein the error margin of said supplementary signal sources extends no more than about 750 mV outside of said nominal range.

12. The circuit of claim 9, wherein the control circuit comprises a switch which disconnects said input signal from said element when said signal goes out of range and connects said selected supplementary signal to said element.

13. The circuit of claim 12, further comprising a second switch for selectively connecting one of said plurality of supplementary signal sources to provide said selected supplementary signals.

14. The circuit of claim 13, wherein the control circuit further comprises a plurality of logic gates which respond to said out-of-range detector, with each of said logic gates controlling a respective one of said switches.

15. The circuit of claim 12, wherein the control circuit further comprises a logic gate which responds to said out-of-range detector and controls said switch.

16. The circuit of claim 9, wherein said saturable circuit element comprises a bipolar junction transistor circuit.

17. The circuit of claim 9, wherein said saturable circuit element comprises a multistep/subranging analog to digital converter.

18. A method of protecting a saturable circuit element from input signals outside a nominal non-saturating range, comprising:

determining whether an input signal is outside said nominal range, determining whether an out-of-range input signal is above or below said nominal range, and in response to a determination that an input signal is outside said nominal range, disconnecting said input signal from said element and providing a substitute signal to said element which is outside said nominal range, on the same side of said range as the input signal, by an amount insufficient to substantially saturate said circuit element.

19. The method of claim 18, wherein said substitute signal is generated within an error margin that is slightly outside said range.

20. The method of claim 19, wherein the error margin of said substitute signal extends no more than about 750 mV out of said nominal range.

* * * * *